(12) United States Patent
Kim (10) Patent No.: US 11,373,938 B2
(45) Date of Patent: Jun. 28, 2022

(54) SUBSTRATE HAVING A PLURALITY OF SLIT PORTIONS BETWEEN SEMICONDUCTOR DEVICES

(71) Applicants: HYUNDAI MOTOR COMPANY, Seoul (KR); KIA MOTORS CORPORATION, Seoul (KR)

(72) Inventor: Young Seok Kim, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/943,976

(22) Filed: Jul. 30, 2020

(65) Prior Publication Data

US 2021/0151364 A1 May 20, 2021

(30) Foreign Application Priority Data

Nov. 14, 2019 (KR) ........................ 10-2019-0145509

(51) Int. Cl.
| | |
|---|---|
| H01L 23/495 | (2006.01) |
| H01L 23/48 | (2006.01) |
| H01L 23/34 | (2006.01) |
| H01L 29/66 | (2006.01) |
| H01L 21/00 | (2006.01) |
| H01L 21/8234 | (2006.01) |

(Continued)

(52) U.S. Cl.
CPC .... *H01L 23/49558* (2013.01); *H01L 23/4952* (2013.01); *H01L 23/49503* (2013.01); *H01L 23/49562* (2013.01); *H01L 23/49575* (2013.01); *H01L 24/97* (2013.01); *H01L 25/072* (2013.01); *H01L 2924/13091* (2013.01)

(58) Field of Classification Search
CPC ......... H01L 23/49558; H01L 23/29503; H01L 23/4952; H01L 23/49562; H01L 23/49575; H01L 2924/13091; H01L 24/97; H01L 25/072
See application file for complete search history.

(56) References Cited

U.S. PATENT DOCUMENTS

| | | | |
|---|---|---|---|
| 8,093,852 B2 | 1/2012 | Nakamura | |
| 10,797,036 B2 * | 10/2020 | Nagase | ................. H02M 7/003 |

(Continued)

FOREIGN PATENT DOCUMENTS

| | | |
|---|---|---|
| JP | 3222341 B2 | 10/2001 |
| JP | 3701228 B2 | 9/2005 |

(Continued)

*Primary Examiner* — Alonzo Chambliss
(74) *Attorney, Agent, or Firm* — Lempia Summerfield Katz LLC (57) ABSTRACT

A structure of a substrate is provided for application in an electric power module. The substrate includes element regions, on which a plurality of semiconductor elements are arranged, a center region that defines a space among the element regions, an input terminal region, on which an input terminal for applying an electric current to the substrate is disposed, and one or more slit insulation portions that are defined to face toward sides, respectively, of the element regions adjacent to the input terminal region, which are among the element regions. The slit insulation portions extend toward the center region in such a manner that an electric current applied through the input terminal region flows into the center region.

15 Claims, 5 Drawing Sheets cross-sectional A'-A (51) Int. Cl.
*H05K 7/18* (2006.01)
*H01L 23/00* (2006.01)
*H01L 25/07* (2006.01)

(56) References Cited

U.S. PATENT DOCUMENTS

| | | | | |
|---|---|---|---|---|
| 2009/0174353 | A1 | 7/2009 | Nakamura | |
| 2013/0009291 | A1* | 1/2013 | Kim | H01L 23/49531 |
| | | | | 438/107 |
| 2015/0130042 | A1* | 5/2015 | Sato | H01L 23/3677 |
| | | | | 257/690 |
| 2021/0159152 | A1* | 5/2021 | Hong | H01L 23/49562 |

FOREIGN PATENT DOCUMENTS

| | | | |
|---|---|---|---|
| JP | 4587378 | B2 | 11/2010 |
| JP | 5029900 | B2 | 9/2012 |
| JP | 5429413 | B2 | 2/2014 |

* cited by examiner

FIG. 3 cross-sectional A'-A

FIG. 4

FIG. 5 cross-sectional B'-B

SUBSTRATE HAVING A PLURALITY OF SLIT PORTIONS BETWEEN SEMICONDUCTOR DEVICES

CROSS REFERENCE TO RELATED APPLICATION

The present application claims priority to Korean Patent Application No. 10-2019-0145509, filed Nov. 14, 2019, the entire contents of which are incorporated herein for all purposes by this reference.

BACKGROUND

Field of the Disclosure

The present disclosure relates to a structure of a substrate for application in an electric power module having a slit insulation portion, which changes a path for an electric current applied to the substrate.

Description of the Related Art

In recent years, much progress has been made in the technological development of an electric power conversion device (for example, an inverter), which is not only one of integral components of a hybrid vehicle and of an electric vehicle, but also an essential component of an environment-friendly vehicle. A development of core technology in the environment-friendly vehicle field is a power module, which is an essential component of the electric power conversion device and accounts for a large percentage of the cost thereof.

The plurality of semiconductor elements is mounted in the electric power module. In a case where an electric current is applied to the electric power module, the electric current is applied to the plurality of semiconductor elements, and the plurality of semiconductor elements converts the applied electric current. Therefore, in a case where the electric currents applied to the semiconductor elements mounted in the electric power module have the same density, the function of the electric power module can be maximized.

In the related art, in order to reduce the electric power modules in size, integrated-type power modules having a modified structure, in which cooling through both sides thereof is provided, have been manufactured. In the case where an electric power module of an existing type for converting an electric power is configured with the plurality of semiconductor elements, electric currents applied to the semiconductor elements have different densities. In other words, when the electric power module is configured with the plurality of semiconductor elements, there occurs a problem that an electric current is not uniformly applied to the semiconductor elements.

SUMMARY

An object of the present disclosure is to provide a structure of a substrate that is capable of changing a path for an electric current applied to the substrate and thus enabling the electric currents applied to the plurality of semiconductor elements to maintain the same density.

According to an aspect of the present disclosure, a structure of a substrate for application in an electric power module is provided. The substrate includes element regions on which the plurality of semiconductor elements is arranged; a center region that defines a space among the element regions; an input terminal region, on which an input terminal for applying an electric current to the substrate is disposed; and one or more slit insulation portions that are defined to face toward sides, respectively, of the element regions adjacent to the input terminal region, which are among the element regions. The slit insulation portions extend toward the center region in such a manner that the electric current applied through the input terminal region flows into the center region.

In the structure according to the aspect, the element regions may include a first element region, a second element region, a third element region, and a fourth element region that are counterclockwise arranged in this order. The first element region and the fourth element region may be adjacent to the input terminal region. The slit insulation portions may include a first slit insulation portion that is defined between the first element region and the input terminal region, and a second slit insulation portion that is defined between the fourth element region and the input terminal region.

In the structure according to the aspect, the first slit insulation portion and the second slit insulation portion may extend from one side of the substrate, on which the input terminal region is defined, toward another side thereof that faces the one side of the substrate.

In the structure according to the aspect, the first slit insulation portion may extend in such a manner as to be closer to the other side of the substrate than the second slit insulation portion.

In the structure according to the aspect, the first slit insulation portion and the second slit insulation portion may be arranged between the first element region and the fourth element region.

In the structure according to the aspect, the first slit insulation portion may include a first main slit insulation portion that is defined between the input terminal region and the first element region, and a first sub-slit insulation portion that is defined to face toward one side of the first element region. The second slit insulation portion may include a second main slit insulation portion that is defined between the input terminal region and the fourth element region, and a second sub-slit insulation portion that is defined to face toward one side of the fourth element region.

In the structure according to the aspect, the first sub-slit insulation portion may extend in a direction from the first element region toward the second element region, and the second sub-slit insulation portion may extend in a direction from the fourth element region toward the third element region.

In the structure according to the aspect, the first sub-slit insulation portion may not protrude beyond an end of the first element region in the direction from the first element region toward the second element region. The second sub-slit insulation portion may not protrude beyond an end of the fourth element region in the direction from the fourth element region toward the third element region.

In the structure according to the aspect, the center region may mean a region that covers a fixed area, of which a center point is positioned equidistantly from the element regions, and the electric current applied through the input terminal region may be applied to the element regions through the center region.

In the structure according to the aspect, the substrate may include a source signal electrode portion that transfers a source signal to the semiconductor elements and a gate signal electrode portion that transfers a gate signal to the semiconductor elements, and the source signal electrode portion and the gate signal electrode portion may be connected to the semiconductor elements through a wire.

The structure according to the aspect may further include: a first electrode insulation portion that is provided between the gate signal electrode portion and the source signal electrode portion; and a second electrode insulation portion that is provided between an outer boundary of the source signal electrode and an edge of the substrate.

According to another aspect of the present disclosure, a structure of a substrate having a first region and a second region for application in an electric power module is provided. Each of the first region and the second region includes: element regions, on which the plurality of semiconductor elements is arranged; a center region that defines a space among the element regions; an input terminal region, on which an input terminal for applying an electric current to the substrate is disposed; and one or more slit insulation portions that are defined to face toward sides, respectively, of the element regions adjacent to the input terminal region, which are among the element regions. The slit insulation portions extend toward the center region in such a manner that the electric current applied through the input terminal region flows into the center region.

In the structure according to the aspect, the input terminal region may include: a first input terminal region which is disposed on the first region and, to which an electric current is applied from the outside; and a second input terminal region that applies the electric current transferred from each of the semiconductor elements arranged on the first region to the second region.

In the structure according to the aspect, the element regions adjacent to the first input terminal region, which are among the element regions defined on the first region, may be defined as first lower element regions. The element regions adjacent to the second input terminal region, which are among the element regions defined on the second region, may be defined as second lower element regions. The slit insulation portions may be provided to face toward one side of each of the first lower element regions and one side of each of the second lower element regions. The slit insulation portions may be provided among the first lower element regions and among the second lower element regions.

In the structure according to the aspect, the slit insulation portions may include: a first slit extension portion and a second slit extension portion that extend from one side of the first region, on which the first input terminal region is defined, toward another side of the first region that faces the one side of the first region; and a third slit extension portion and a fourth slit extension portion that extend from one side of the second region, on which the second input terminal region is defined, toward another side of the second region that faces the one side of the second region.

In the structure according to the aspect, the first slit extension portion and the second slit extension portion may be defined to face toward sides, respectively, of the first lower element regions, and the first slit extension portion and the second slit extension portion may not protrude beyond ends, respectively, of the first lower element regions that are adjacent thereto.

In the structure according to the aspect, multiple third slit extension portions and multiple fourth slit extension portions are provided to face toward sides, respectively, of the second lower element regions, and the multiple third slit extension portions and the multiple fourth slit extension portions may not protrude beyond the ends, respectively, of the second lower element regions that are adjacent thereto.

A slit insulation portion according to an embodiment of the present disclosure can change a path for an electric current applied through an input terminal in order to enable the electric currents applied to each of the semiconductor elements to maintain the same density.

The slit insulation portion according to the embodiment of the present disclosure prevents an electric current from being transferred directly to the semiconductor elements adjacent to the input terminal and thus enabling the electric current applied to the semiconductor elements not adjacent to the input terminal and to the semiconductor elements adjacent to the input terminal to have the same density.

DETAILED DESCRIPTION

Advantages and features of the present disclosure and methods of achieving the advantages and the features should be apparent from the accompanying drawings and from embodiments described in detail below. However, the present disclosure is not limited to the embodiments disclosed below, and various different embodiments thereof can be realized. The embodiments are provided to make a complete disclosure of the present disclosure and to put a person of ordinary skill in the art to which the present disclosure pertains on full notice as to the scope of the disclosure. The scope of the present disclosure should be only defined in claims. The same reference character throughout the specification refers to the same or equivalent constituent element.

The term "unit", "module", or the like, which is used throughout the specification, means an individual component that performs at least one function or operation and may be realized in hardware, in software, or both in hardware and in software. When a component, device, element, or the like of the present disclosure is described as having a purpose or performing an operation, function, or the like, the component, device, or element should be considered herein as being "configured to" meet that purpose or to perform that operation or function. Further, the controller described herein may include a processor programmed to perform the noted operation, function, operation, or the like.

In addition, in order to distinguish among constituent elements that have the same name, the terms first, second, and so on are used throughout the present specification. In the following description, no limitation to this order is necessarily imposed.

The present disclosure is described in detail in an illustrative manner. In addition, the above description is provided for embodiments of the present disclosure, and various different combinations of, and various modifications to the present disclosure may be made under various environments. Modifications or alterations to the disclosure are possible within the scope of the concept of the examples or embodiments disclosed in the present specification, the scope of equivalents of the contents of the described disclosure, and/or the scope of technology or knowledge in the art. Optimal requirements for realizing the technical idea of the present disclosure are described for the embodiments. Various modifications that are required in the field in which the present disclosure finds application and that are required to use the present disclosure are also possible. Therefore, the above detailed description relating to the disclosure is not intended to impose any limitation on the disclosed embodiments. In addition, the claims should be construed to cover other embodiments as well.

Figure 1:
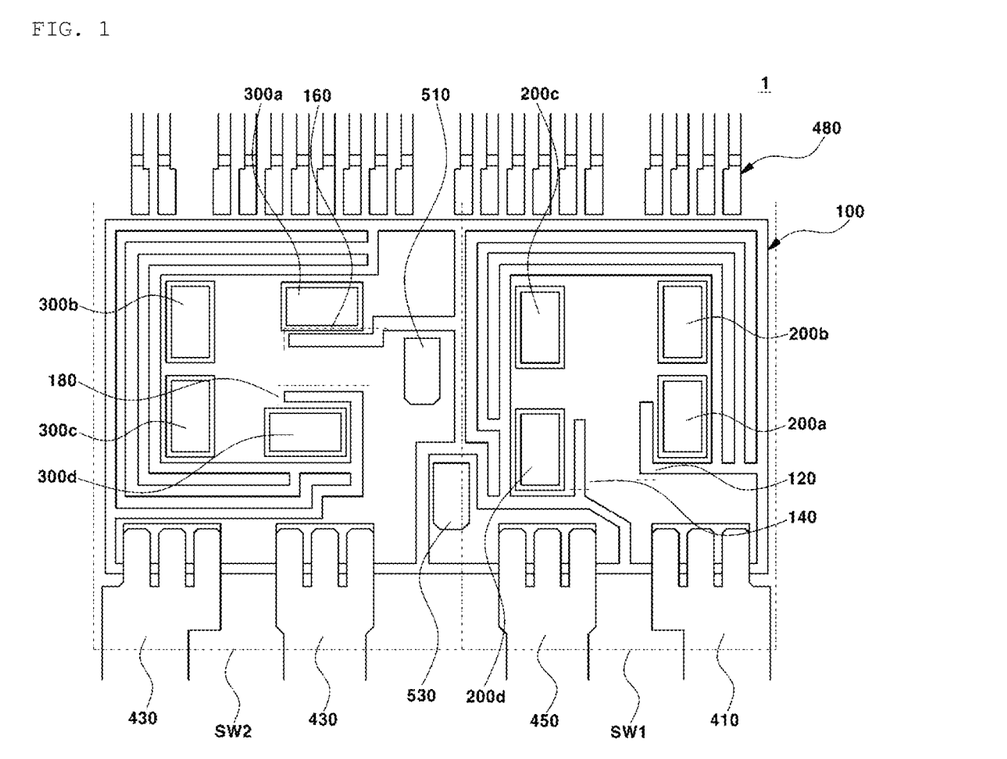
FIG. 1 is a diagram illustrating an electric power module according to an embodiment of the present disclosure.

FIG. 1 is a diagram illustrating an electric power module according to an embodiment of the present disclosure.

With reference to FIG. 1, an electric power module 1 includes a first switching unit SW1 and a second switching unit SW2. The first switching unit SW1 includes the plurality of constituent elements mounted on a first area of the substrate 100, and the second switching unit SW2 includes the plurality of constituent elements mounted on a second area of the substrate 100. The first switching unit SW1 and the second switching unit SW2 are connected electrically to each other. The first switching unit SW1 is a high-side switching unit and includes high-side semiconductor elements 200a, 200b, 200c, and 200d, a first input terminal 410, and an output terminal 450. The second switching unit SW2 is a low-side switching unit and may include low-side semiconductor elements 300a, 300b, 300c, and 300d, a second input terminal 510, and an alternating current terminal 430. For example, the semiconductor elements 200a, 200b, 200c, 200d, 300a, 300b, 300c, and 300d are MOSFETs that are formed of a material selected from the group consisting of SiC, Si, and GaN. Electric currents that result from conversion by the high-side semiconductor elements 200a, 200b, 200c, and 200d are applied to the second input terminal 510, and an electric current applied through the second input terminal 510 is applied to the low-side semiconductor elements 300a, 300b, 300c, and 300d and the alternating current terminal 430. Electric currents that result from conversion by the low-side semiconductor elements 300a, 300b, 300c, and 300d are applied to a connection terminal 530. The electric current applied to the connection terminal 530 is output through the output terminal 450 connected electrically to the connection terminal 530. The second input terminal 510 plays a role as a connection terminal that connects between the first switching unit SW1 and the second switching unit SW2 on the substrate 100. The second input terminal 510 also plays a role as an input terminal for applying an electric current to the low-side semiconductor elements 300a, 300b, 300c, and 300d of the second switching unit SW2. The electric power module 1 according to an embodiment of the present disclosure is configured to employ a two-in-one structure in which the first switching unit SW1 and the second switching unit SW2 are formed on one substrate 100. Therefore, two alternating current terminals 430 are present.

The substrate 100 includes a conductive layer. Multiple substrates 100 may be provided on the electric power module 1. For example, the electric power module 1 may include an upper substrate and a lower substrate. The upper substrate and the lower substrate transfer the applied electric current to the semiconductor elements 200a, 200b, 200c, and 200d, and the semiconductor elements 300a, 300b, 300c, and 300d, respectively, and are connected electrically to the plurality of terminals, terminals 410, 430, 450, 510, and 530. In other words, the substrate 100 provides regions on which the semiconductor elements 200a, 200b, 200c, 200d, 300a, 300b, 300c, and 300d, and the terminals 410, 430, 450, 510, and 530 are mounted, and electrically connects the semiconductor elements 200a, 200b, 200c, 200d, 300a, 300b, 300c, and 300d and the terminals 410, 430, 450, 510, and 530.

The substrate 100 is divided into the first region and the second region. The first region of the substrate 100 and the second region are insulated electrically from each other. The high-side semiconductor elements 200a, 200b, 200c, and 200d, the first input terminal 410, and the output terminal 450 are provided on the first region of the substrate 100. The low-side semiconductor elements 300a, 300b, 300c, and 300d, the second input terminal 510, and the alternating current terminal 430 are provided on the second region of the substrate 100. In order to connect electrically between the first region and the second region of the substrate 100, the second input terminal 510 and the connection terminal 530 are provided on the substrate 100.

The high-side semiconductor elements 200a, 200b, 200c, and 200d are counterclockwise arranged. The high-side semiconductor elements 200a, 200b, 200c, and 200d include a first high-side semiconductor element 200a, a second high-side semiconductor element 200b, a third high-side semiconductor element 200c, and a fourth high-side semiconductor element 200d. The first high-side semiconductor element 200a and the fourth high-side semiconductor element 200d are arranged in such a manner as to be adjacent to the first input terminal 410. Specifically, the first high-side semiconductor element 200a is disposed in such a manner as to be adjacent to the first input terminal 410, and the fourth high-side semiconductor element 200d is disposed in such a manner as to be adjacent to the output terminal 450. However, the first high-side semiconductor element 200a and the fourth high-side semiconductor element 200d are insulated electrically from the output terminal 450 by a pattern formed on the substrate 100.

Slit insulation portions 120 and 140 are defined on the first region of the substrate 100. The slit insulation portions 120 and 140 mean spaces that result from removing a conductive layer that makes up the substrate 100. The slit insulation portions 120 and 140 prevent an electric current applied through the first input terminal 410 from concentrating on the first high-side semiconductor element 200a and the fourth high-side semiconductor element 200d, respectively. Specifically, the slit insulation portions 120 and 140 are defined between the first input terminal 410 and the first high-side semiconductor element 200a and between the first input terminal 410 and the fourth high-side semiconductor element 200d, respectively, and provide guidance in such a manner that the electric current applied through the first input terminal 410 is transferred to a space among the high-side semiconductor elements 200a, 200b, 200c, and 200d and then is applied to the high-side semiconductor elements 200a, 200b, 200c, and 200d. In other words, the slit insulation portions 120 and 140 change paths along which an electric current flows, in order to prevent the electric current applied through the first input terminal 410 from being transferred directly to the first high-side semiconductor element 200a and the fourth high-side semiconductor element 200d, respectively.

The slit insulation portions 120 and 140 are defined to face toward sides, respectively, of the high-side semiconductor elements 200a and 200d adjacent to the first input terminal 410, which are among the high-side semiconductor elements 200a, 200b, 200c, and 200d. Specifically, the slit insulation portions 120 and 140 include a first slit insulation portion 120, which is defined on the substrate 100 to face toward one side of the first high-side semiconductor element 200a, and a second slit insulation portion 140, which is defined on the substrate 100 to face toward one side of the fourth high-side semiconductor element 200d. The first slit insulation portion 120 and the second slit insulation portion 140 extend in a direction from one side of the substrate 100, on which the first input terminal 410 is positioned, toward the other side thereof facing the one side. In other words, the first slit insulation portion 120 extends in a direction from the first high-side semiconductor element 200a toward the second high-side semiconductor element 200b, and the second slit insulation portion 140 extends in a direction from the fourth high-side semiconductor element 200d toward the third high-side semiconductor element 200c. The first slit insulation portion 120 extends in a direction from one side of the substrate 100 toward the other side thereof but does not protrude beyond an end of the first high-side semiconductor element 200a. The second slit insulation portion 140 extends in a direction from one side of the substrate 100 toward the other side thereof but does not protrude beyond an end of the fourth high-side semiconductor element 200d. The first slit insulation portion 120 extends in such a manner as to be closer to the other side than the second slit insulation portion 140. The first slit insulation portion 120 and the second slit insulation portion 140 are defined in a space between the first high-side semiconductor element 200a and the fourth high-side semiconductor element 200d.

The low-side semiconductor elements 300a, 300b, 300c, and 300d are counterclockwise arranged. The low-side semiconductor elements 300a, 300b, 300c, and 300d include a first low-side semiconductor element 300a, a second low-side semiconductor element 300b, a third low-side semiconductor element 300c, and a fourth low-side semiconductor element 300d. The first low-side semiconductor element 300a and the fourth low-side semiconductor element 300d are arranged in such a manner as to be adjacent to the second input terminal 510. The first low-side semiconductor element 300a and the fourth low-side semiconductor element 300d are insulated electrically from the output terminal 450 by a pattern formed on the substrate 100.

Slit insulation portions 160 and 180 are defined on the second region of the substrate 100. The slit insulation portions 160 and 180 mean spaces that result from removing a conductive layer that makes up the substrate 100. The slit insulation portions 160 and 180 prevent the electric current applied through the second input terminal 510 from concentrating on the first low-side semiconductor element 300a and the fourth low-side semiconductor element 300d, respectively. Specifically, the slit insulation portions 160 and 180 are defined between the second input terminal 510 and the first low-side semiconductor element 300a and between the second input terminal 510 and the fourth low-side semiconductor element 300d, respectively, and provide guidance in such a manner that the electric current applied through the second input terminal 510 is transferred to a space among the low-side semiconductor elements 300a, 300b, 300c, and 300d and then is applied to the low-side semiconductor elements 300a, 300b, 300c, and 300d. In other words, the slit insulation portions 160 and 180 change paths along which an electric current flows, in order to prevent the electric current applied through the second input terminal 510 from being transferred directly to the first low-side semiconductor element 300a and the fourth low-side semiconductor element 300d.

The slit insulation portions 160 and 180 are defined to face toward sides, respectively, of the low-side semiconductor elements 300a and 300d adjacent to the second input terminal 510, which are among the low-side semiconductor elements 300a, 300b, 300c, and 300d. Specifically, the slit insulation portions 160 and 180 include a third slit insulation portion 160, which is defined on the substrate 100 to face toward one side of the first high-side semiconductor element 300a, and a fourth slit insulation portion 180, which is defined on the substrate 100 to face toward one side of the fourth high-side semiconductor element 300d. The third slit insulation portion 160 and the fourth slit insulation portion 180 extend in a direction from one side of the substrate 100, on which the second input terminal 510 is disposed toward the other side thereof facing the one side. In other words, the third slit insulation portion 160 extends in a direction from the first low-side semiconductor element 300a toward the second low-side semiconductor element 300b, and the fourth slit insulation portion 180 extends in a direction from the fourth low-side semiconductor element 300d toward the third low-side semiconductor element 300c. The third slit insulation portion 160 extends in a direction from one side of the substrate 100 toward the other side thereof but does not protrude beyond an end of the first low-side semiconductor element 300a. The fourth slit insulation portion 180 extends in a direction from one side of the substrate 100 toward the other side thereof but does not protrude beyond an end of the fourth low-side semiconductor element 300d. The third slit insulation portion 160 extends in such a manner as to be closer to the other side than the fourth slit insulation portion 180. The third slit insulation portion 160 and the fourth slit insulation portion 180 are defined in a space between the first low-side semiconductor element 300a and the fourth low-side semiconductor element 300d.

A frame portion 480 includes multiple frame terminals and is connected to an external controller (not illustrated) and to the semiconductor elements 200a, 200b, 200c, 200d, 300a, 300b, 300c, and 300d through at least one frame terminal. The frame portion 480 transfers a control signal of the external controller to the semiconductor elements 200a, 200b, 200c, 200d, 300a, 300b, 300c, and 300d. For example, the frame portion 480 is connected electrically to the substrate 100 through a wire (not illustrated).

According to an embodiment of the present disclosure, the slit insulation portions 120 and 140 serve to uniformly transfer the electric current applied through the first input terminal 410 to the semiconductor elements 200a, 200b, 200c, and 200d, and the slit insulation portions 160, and 180 serve to uniformly transfer the electric current applied through the second input terminal 510 to the semiconductor elements 300a, 300b, 300c, and 300d. The slit insulation portions 120 and 140 prevent the electric current from being transferred directly to the semiconductor elements 200a, 200b, 200c, and 200d adjacent to the first input terminal 410. The slit insulation portions 160 and 180 prevent the electric current from being transferred directly to the semiconductor elements 300a, 300b, 300c, and 300d adjacent to the first input terminal 510. In other words, the slit insulation portions 120 and 140 change paths for an electric current applied through the first input terminal 410, in order to uniformly maintain the electric current that is transferred to the semiconductor elements 200a, 200b, 200c, and 200d, and the slit insulation portions 160 and 180 change paths for an electric current applied through the second input terminal 510, in order to uniformly maintain the electric current that is transferred to the semiconductor elements 300a, 300b, 300c, and 300d.

Figure 2:
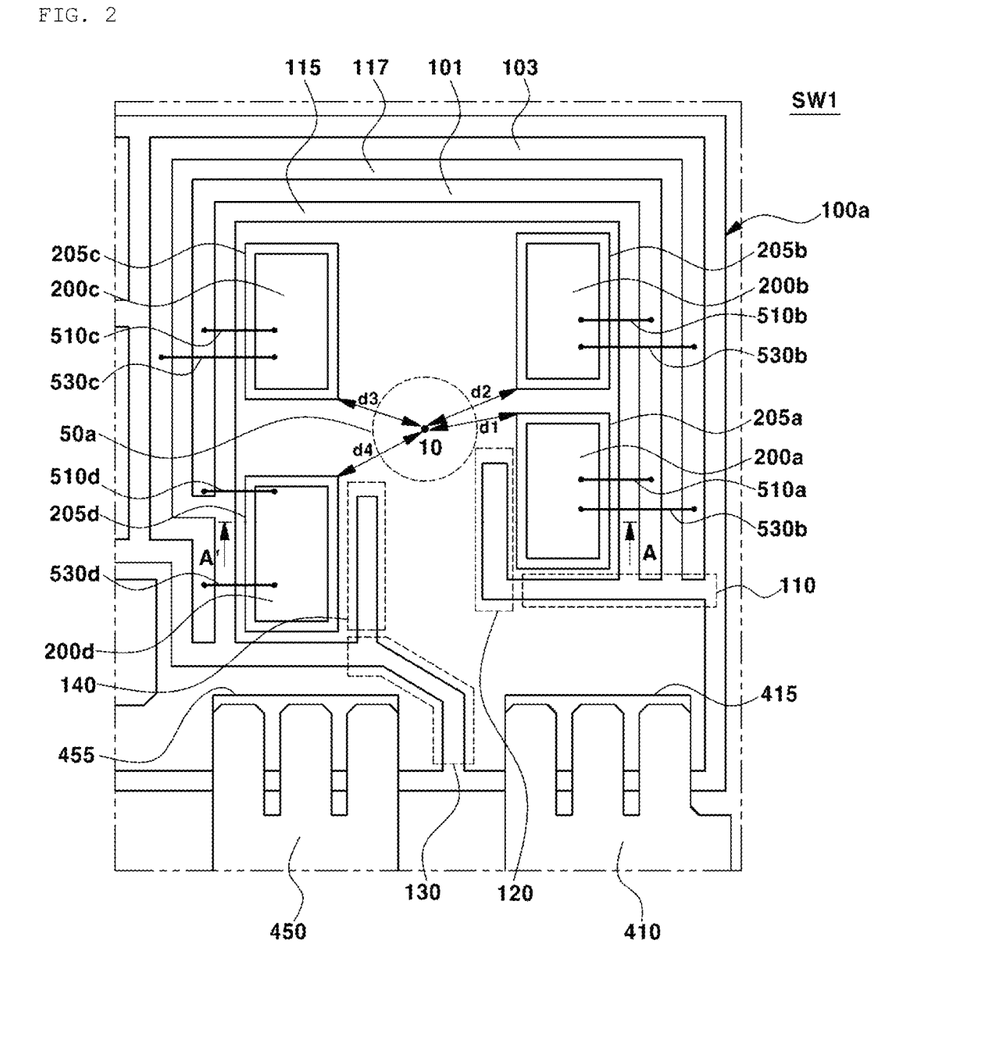
FIG. 2 is a diagram illustrating a first region of a substrate according to an embodiment of the present disclosure.

FIG. 2 is a diagram illustrating a first region of a substrate according to an embodiment of the present disclosure.

With reference to FIGS. 1 and 2, element regions 205a, 205b, 205c, and 205d, a first center region 50a, a first input terminal region 415, an output terminal region 455, and slit insulation portions 110, 120, 130, and 140 are defined on a first region 100a of the substrate 100, on which the first switching unit SW1 is formed.

The element regions 205a, 205b, 205c, and 205d mean regions on which the high-side semiconductor elements 200a, 200b, 200c, and 200d are arranged. In other words, the first high-side semiconductor element 200a is disposed on a first element region 205a, the second high-side semiconductor element 200b is disposed on a second element region 205b, the third high-side semiconductor element 200c is disposed on a third element region 205c, and the fourth high-side semiconductor element 200d is disposed on a fourth element region 205d. The first element region 205a, the second element region 205b, the third element region 205c, and the fourth element region 205d are counterclockwise defined. Specifically, the first element region 205a and the fourth element region 205d are adjacent to the first input terminal region 415, on which the first input terminal 410 is disposed.

The first center region 50a means a space among the element regions 205a, 205b, 205c, and 205d or a space among the high-side semiconductor elements 200a, 200b, 200c, and 200d. Specifically, the first center region 50a means a region that covers a fixed area, of which a first center point 10 is positioned equidistantly from the element regions 205a, 205b, 205c, and 205d or the high-side semiconductor elements 200a, 200b, 200c, and 200d. A distance between the first center point 10 and the first element region 205a or the first high-side semiconductor element 200a is defined as a first distance d1. A distance between the first center point 10 and the second element region 205b or the second high-side semiconductor element 200b is defined as a second distance d2.

A distance between the first center point 10 and the third element region 205c or the third high-side semiconductor element 200c is defined as a third distance d3. A distance between the first center point 10 and the fourth element region 205d or the fourth high-side semiconductor element 200d is defined as a fourth distance d4. In this embodiment, the first distance d1, the second distance d2, the third distance d3, and the fourth distance d4 are the same. An electric current applied through the first input terminal region 415 is applied to the element regions 205a, 205b, 205c, and 205d through the first center region 50a. Therefore, lengths of paths along which the electric current transferred to the first center region 50a is transferred to the high-side semiconductor elements 200a, 200b, 200c, and 200d, respectively, are the same. Thus, the electric currents that are transferred to the high-side semiconductor elements 200a, 200b, 200c, and 200d have a uniform density.

The slit insulation portions 110, 120, 130, and 140 provide guidance in such a manner that the electric current applied through the first input terminal 410 flows into the first center region 50a. In other words, the slit insulation portions 110, 120, 130, and 140 change paths along which an electric current flows. One or more of the slit insulation portions 110, 120, 130, and 140 are defined to face toward sides, respectively, of the element regions 205a and 205d adjacent to the first input terminal region 415, which are among the element regions 205a, 205b, 205c, and 205d.

The slit insulation portions 110, 120, 130, and 140 include first slit insulation portions 110 and 120, which are defined between the first element region 205a and the first input terminal region 415, and second slit insulation portions 130 and 140, which are defined between the fourth element region 205d and the first input terminal region 415. The first slit insulation portions 110 and 120 include a first main slit insulation portion 110, which is defined between the first input terminal region 415 and the first element region 205a, and a first sub-slit insulation portion 120, which is defined to face toward one side of the first element region 205a. The second slit insulation portions 130 and 140 include a second main slit insulation portion 130, which is defined between the first input terminal region 415 and the fourth element region 205d, and a second sub-slit insulation portion, which is defined to face toward one side of the fourth element region 205d. The first sub-slit insulation portion 120 extends in a direction from the first element region 205a toward the second element region 205b, and the second sub-slit insulation portion 140 extends in a direction from the fourth element region 205d toward the third element region 205c. The first sub-slit insulation portion 120 does not protrude beyond an end of the first element region 205 in a direction from the first element region 205a toward the second element region 205b. In other words, in a case where the first sub-slit insulation portion 120 protruded beyond the end of the first element region 205a, an electric current would be prevented from flowing from the first center region 50a into the first high-side semiconductor element 200a. Therefore, the first sub-slit insulation portion 120 does not protrude beyond the end of the first element region 205a. The second sub-slit insulation portion 140 does not protrude beyond an end of the fourth element region 205d in a direction from the fourth element region 205d toward the third element region 205c. In other words, in a case where the second sub-slit insulation portion 140 protruded beyond the end of the fourth element region 205d, an electric current would be prevented from flowing from the first center region 50a into the fourth high-side semiconductor element 200d. Therefore, the second sub-slit insulation portion 140 does not protrude beyond the end of the fourth element region 205d.

A gate signal electrode portion 101, which transfers a gate signal to the high-side semiconductor elements 200a, 200b, 200c, and 200d, and a source signal electrode portion 103, which transfers a source signal to the high-side semiconductor elements 200a, 200b, 200c, and 200d, are defined on the substrate 100. The gate signal electrode portion 101 and the source signal electrode portion 103 are connected electrically to the frame portion 480. The gate signal electrode portion 101 and the source signal electrode portion 103 are not connected directly to the high-side semiconductor elements 200a, 200b, 200c, and 200d, due to a first electrode insulation portion 115 and a second electrode insulation portion 117, respectively. Specifically, the first electrode insulation portion 115 is provided between the gate signal electrode portion 101 and the source signal electrode portion 103, and the second electrode insulation portion 117 is provided between the source signal electrode portion 103 and an edge of the substrate 100. According to an embodiment of the present disclosure, one end of the first electrode insulation portion 115 and one end of the second electrode insulation portion 117 are connected to the first main slit insulation portion 110. One end of the first electrode insulation portion 115 and one end of the second electrode insulation portion 117 mean the ends adjacent to the first high-side semiconductor element 200a. The first electrode insulation portion 115 and the second electrode insulation portion 117 are connected to each other where they are adjacent to the fourth high-side semiconductor element 200d.

The gate signal electrode portion 101 and the source signal electrode portion 103 are connected to the high-side semiconductor elements 200a, 200b, 200c, and 200d through high-side wires 510a, 510b, 510c, and 510d, and high-side wires 530a, 530b, 530c, and 530d, respectively. The high-side wires 510a, 510b, 510c, 510d, 530a, 530b, 530c, and 530d include first high-side wires 510a, 510b, 510c, and 510d, which are connected to gate electrodes, respectively, of the high-side semiconductor elements 200a, 200b, 200c, and 200d, and second high-side wires 530a, 530b, 530c, and 530d, which are connected to source electrodes, respectively, of the semiconductor elements 200a, 200b, 200c, and 200d. In other words, the high-side semiconductor elements 200a, 200b, 200c, and 200d are not connected directly to the substrate 100, due to the first electrode insulation portion 115 and the second electrode insulation portion 117. However, a control signal that is applied through the frame portion 480 is applied to the high-side semiconductor elements 200a, 200b, 200c, and 200d through the high-side wires 510a, 510b, 510c, 510d, 530a, 530b, 530c, and 530d.

According to an embodiment of the present disclosure, the slit insulation portions 110, 120, 130, and 140 provide guidance in such a manner that the electric current applied through the first input terminal 410 flows into the first center region 50a. The slit insulation portions 110 and 120 and the slit insulation portions 130 and 140 prevent the electric current applied through the first input terminal 410 from being transferred directly to a first high-side element region 205a and the fourth high-side element region 205d, respectively, which are first lower element regions. Therefore, an electric current that flows through the slit insulation portions 110, 120, 130, and 140 flows into the first center region 50a and is applied from the first center region 50a to element regions 205a, 205b, 205c, and 205d.

Figure 3:
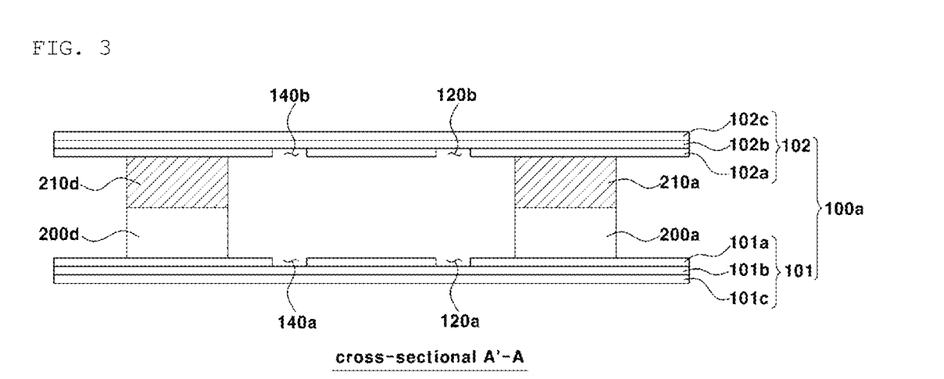
FIG. 3 is a cross-sectional diagram taken along line A-A' in FIG. 2.

FIG. 3 is a cross-sectional diagram taken along line A-A' in FIG. 2.

With reference to FIGS. 1-3, a substrate 100a includes a lower substrate 101 and an upper substrate 102. The lower substrate 101 includes an upper conductive layer 101a, an insulation layer 101b, and a lower conductive layer 101c. The upper substrate 102 includes an upper conductive layer 102c, an insulation layer 102b, and a lower conductive layer 102a. According to an embodiment of the present disclosure, the high-side semiconductor elements 200a, 200b, 200c, and 200d, the first input terminal 410, and the output terminal 450 are described as being arranged on the lower substrate 101. Therefore, the electric current applied through the first input terminal 410 flows into the high-side semiconductor elements 200a, 200b, 200c, and 200d through the upper conductive layer 101a of the lower substrate 101. Electric currents that result from conversion through the high-side semiconductor elements 200a and 200b and the high-side semiconductor elements 200c and 200d flow into the lower conductive layer 102a of the upper substrate 102 through spacers 210a and 210d, respectively. An electric current is transferred to the second input terminal 510 of the second switching unit SW2 through the upper conductive layer 102c on the upper substrate 102.

Slit insulation portions 120a, 120b, 140a, and 140b are formed in one or both of the lower substrate 101 and the upper substrate 102. In one embodiment, the slit insulation portions 120a, 120b, 140a, and 140b are formed in the lower substrate 101, which is a substrate on which the high-side semiconductor elements 200a, 200b, 200c, and 200d are mounted. In another embodiment, the slit insulation portions 120a, 120b, 140a, and 140b may be formed in the upper substrate 102.

The slit insulation portions 120a and 140a mean portions that result from removing, portions, respectively, of the upper conductive layer 101a from the lower substrate 101. The slit insulation portions 120b and 140b mean portions that result from removing, portions, respectively, of the lower conductive layer 102a from the lower substrate 102. With the removal of the portions of the upper and lower conductive layers 101a and 102a, respectively, a pattern is formed in each of the upper conductive layer 101a of the lower substrate 101 and the lower conductive layer 102a of the upper substrate 102. Paths for electric current are determined by the patterns, respectively. Therefore, with the slit insulation portions 120a, 120b, 140a, and 140b, the electric current applied through the first input terminal 410 flows into the first center region 50a.

For brief description, a structure in which semiconductor elements are arranged between two substrates, the substrates 101 and 102, is employed, but the slit insulation portions 120a, 120b, 140a, and 140b may find application in a double-sided electric power module in which semiconductor elements are arranged on each of the upper surface and the lower surface of one substrate. Specifically, the slit insulation portions 120a, 120b, 140a, and 140b may find application in a double-sided electric power module in which semiconductor elements are also arranged on the lower conductive layer 101c of the lower substrate 101.

Figure 4:
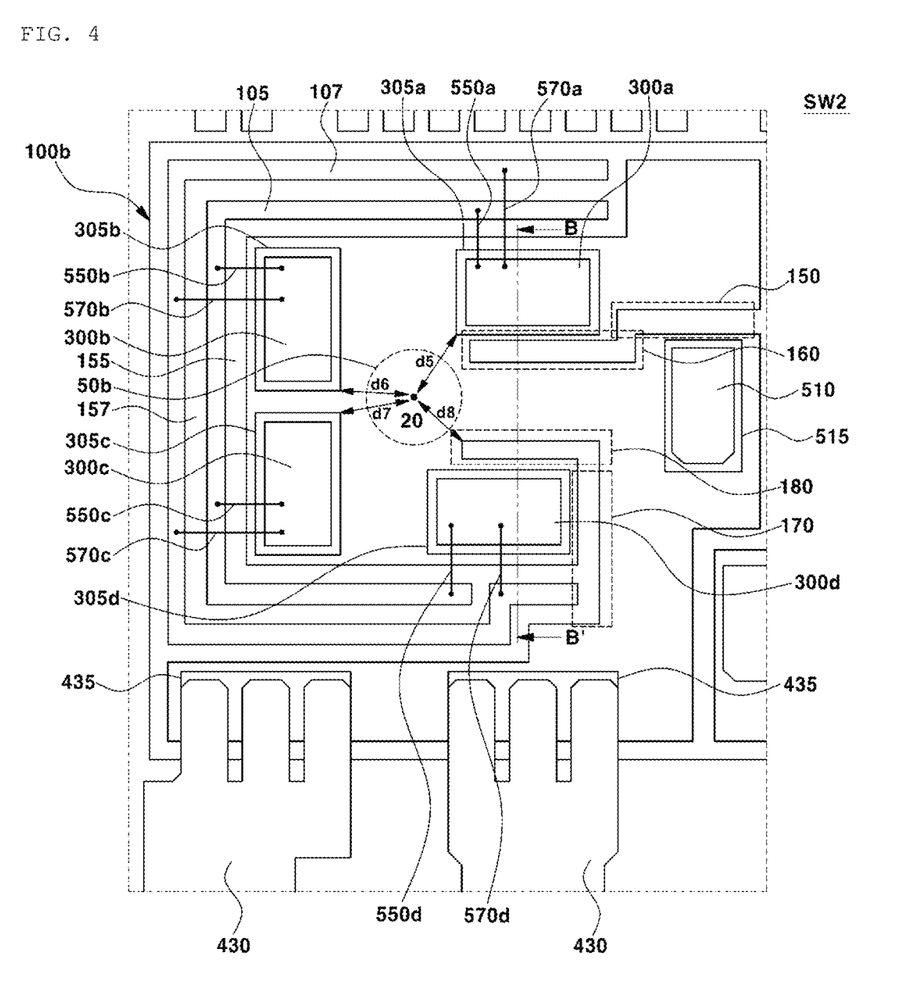
FIG. 4 is a diagram illustrating a second region of the substrate according to the embodiment of the present disclosure.

FIG. 4 is a diagram illustrating the second region of the substrate according to the embodiment of the present disclosure.

With reference to FIGS. 1 and 4, the element regions 305a, 305b, 305c, and 305d, a second center region 50b, the second input terminal region 515, an alternating current terminal region 435, and slit insulation portions 150, 160, 170, and 180 are defined on the second regions 100b of the substrate 100 for application in the second switching unit SW2.

The element regions 305a, 305b, 305c, and 305d mean regions on which the low-side semiconductor elements 300a, 300b, 300c, and 300d, respectively, are arranged. In other words, the first low-side semiconductor element 300a is disposed on a first element region 305a, the second low-side semiconductor element 300b is disposed on a second element region 305b, the third low-side semiconductor element 300c is disposed on a third element region 305c, and the fourth low-side semiconductor element 300d is formed on a fourth element region 305d. The first element region 305a, the second element region 305b, the third element region 305c, and the fourth element region 305d are counterclockwise defined. Specifically, the first element region 305a and the fourth element region 305d are adjacent to a second input terminal region 515, on which the second input terminal 510 is disposed.

The second center region 50b means a space among the element regions 305a, 305b, 305c, and 305d or a space among the low-side semiconductor elements 300a, 300b, 300c, and 300d. Specifically, the second center region 50b means a region that covers a fixed area, of which a second center point 20 is positioned equidistantly from the element regions 305a, 305b, 305c, and 305d or the low-side semiconductor elements 300a, 300b, 300c, and 300d. A distance between the second center point 20 and the first element region 305a or the first low-side semiconductor element 300a is defined as a fifth distance d5. A distance between the second center point 20 and the second element region 305b or the second low-side semiconductor element 300b is defined as a sixth distance d6. A distance between the second center point 20 and the third element region 305c or the third low-side semiconductor element 300c is defined as a seventh distance d7. A distance between the second center point 20 and the fourth element region 305d or the fourth low-side semiconductor element 300d is defined as an eighth distance d8. In this embodiment, the fifth distance d5, the sixth distance d6, the seventh distance d7, and the eighth distance d8 are the same. An electric current applied through the second input terminal region 515 is applied to the element regions 305a, 305b, 305c, and 305d through the second center region 50b. Therefore, lengths of paths along which the electric current transferred to the second center region 50b is transferred to the low-side semiconductor elements 300a, 300b, 300c, and 300d, respectively, are the same. Thus, the electric currents that are transferred to the low-side semiconductor elements 300a, 300b, 300c, and 300d have a uniform density.

The slit insulation portions 150, 160, 170, and 180 provide guidance in such a manner that the electric current applied through the second input terminal 510 flows into the second center region 50b. In other words, the slit insulation portions 150, 160, 170, and 180 change paths along which an electric current flows. One or more of the slit insulation portions 150, 160, 170, and 180 are defined to face toward sides, respectively, of the element regions 305a and 305d adjacent to the second input terminal region 515, which are among the element regions 305a, 305b, 305c, and 305d.

The slit insulation portions 150, 160, 170, and 180 include third slit insulation portions 150 and 160, which are defined between the first element region 305a and the second input terminal region 515, and fourth slit insulation portions 170 and 180, which are defined between the fourth element region 305d and the second input terminal region 515. The third slit insulation portions 150 and 160 include a third main slit insulation portion 150, which is defined between the second input terminal region 515 and the first element region 305a, and a third sub-slit insulation portion 160, which is defined to face toward one side of the first element region 305a. The fourth slit insulation portions 170 and 180 include a fourth main slit insulation portion 170, which is defined between the second input terminal region 515 and the fourth element region 305d, and a fourth sub-slit insulation portion 180, which is defined to face toward one side of the fourth element region 305d. The third sub-slit insulation portion 160 extends in a direction from the first element region 305a toward the second element region 305b, and the fourth sub-slit insulation portion 180 extends in a direction from the fourth element region 305d toward the third element region 305c. The third sub-slit insulation portion 160 does not protrude beyond an end of the first element region 305a in a direction from the first element region 305a toward the second element region 305b. In other words, in a case where the third sub-slit insulation portion 160 protruded beyond the end of the first element region 305a, an electric current would be prevented from flowing from the second center region 50b into the first low-side semiconductor element 300a. Therefore, the third sub-slit insulation portion 160 does not protrude beyond the end of the first element region 305a. The fourth sub-slit insulation portion 180 does not protrude beyond the end of the fourth element region 305d in a direction from the fourth element region 305d toward the third element region 305c. In other words, in a case where the fourth sub-slit insulation portion 180 protruded beyond the end of the fourth element region 305d, an electric current would be prevented from flowing from the second center region 50b into the fourth low-side semiconductor element 300d. Therefore, the fourth sub-slit insulation portion 180 does not protrude beyond the end of the fourth element region 305d.

A gate signal electrode portion 105, which transfers a gate signal to the low-side semiconductor elements 300a, 300b, 300c, and 300d and a source signal electrode portion 107, which transfers a source signal to the low-side semiconductor elements 300a, 300b, 300c, and 300d, are defined on the substrate 100. The gate signal electrode portion 105 and the source signal electrode portion 107 are connected electrically to the frame portion 480. The gate signal electrode portion 105 and the source signal electrode portion 107 are not connected directly to the low-side semiconductor elements 300a, 300b, 300c, and 300d, due to a third electrode insulation portion 155 and a fourth electrode insulation portion 157, respectively. Specifically, the third electrode insulation portion 155 is provided between the gate signal electrode portion 105 and the source signal electrode portion 107, and the fourth electrode insulation portion 157 is provided between the source signal electrode portion 107 and an edge of the substrate 100. According to an embodiment of the present disclosure, one end of the third electrode insulation portion 155 and one end of the fourth electrode insulation portion 157 are connected to the fourth main slit insulation portion 170. One end of the third electrode insulation portion 155 and one end of the fourth electrode insulation portion 157 mean the ends adjacent to the fourth low-side semiconductor element 300d. The third electrode insulation portion 155 and the fourth electrode insulation portion 157 are connected to each other where they are adjacent to the first low-side semiconductor element 300a.

The gate signal electrode portion 105 and the source signal electrode portion 107 are connected to the low-side semiconductor elements 300a, 300b, 300c, and 300d through low-side wires 550a, 550b, 550c, and 550d, and low-side wires 570a, 570b, 570c, and 570d, respectively. The low-side wires 550a, 550b, 550c, 550d, 570a, 570b, 570c, and 570d include first low-side wires 550a, 550b, 550c, and 550d, which are connected to gate electrodes, respectively, of the low-side semiconductor elements 300a, 300b, 300c, and 300d, and second low-side wires 570a, 570b, 570c, and 570d, which are connected to source electrodes, respectively, of the semiconductor elements 300a, 300b, 300c, and 300d. In other words, the low-side semiconductor elements 300a, 300b, 300c, and 300d are not connected directly to the substrate 100, due to the third electrode insulation portion 155 and the fourth electrode insulation portion 157. However, the control signal that is applied through the frame portion 480 is applied to the low-side semiconductor elements 300a, 300b, 300c, and 300d through the low-side wires 550a, 550b, 550c, 550d, 570a, 570b, 570c, and 570d.

According to an embodiment of the present disclosure, the slit insulation portions 150, 160, 170, and 180 provide guidance in such a manner that the electric current applied through the second input terminal 510 flows into the second center region 50b. The slit insulation portions 150 and 160 and the slit insulation portions 170 and 180 prevent the electric current applied through the second input terminal 510 from being transferred directly to the first low-side element region 305a and the fourth low-side element region 305d, respectively, which are second lower element regions. Therefore, an electric current that flows through the slit insulation portions 150, 160, 170, and 180 flows into the second center region 50b and is applied from the second center region 50b to the element regions 305a, 305b, 305c, and 305d.

Figure 5:
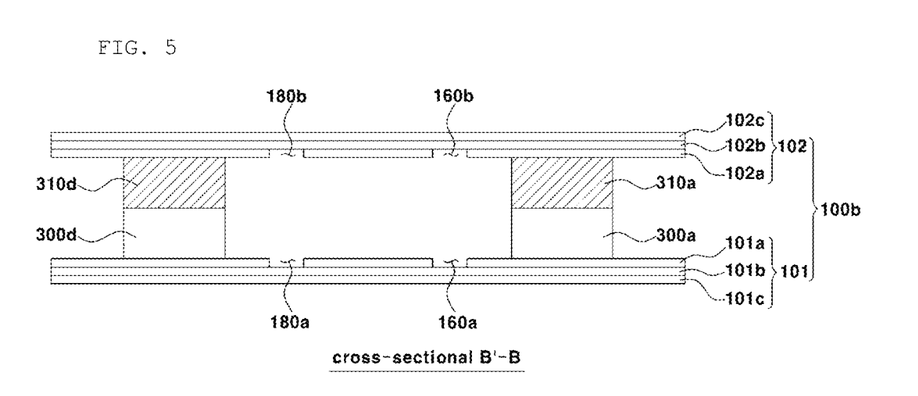
FIG. 5 is a cross-sectional diagram taken along line B-B' in FIG. 4.

FIG. 5 is a cross-sectional diagram taken along line B-B' in FIG. 4.

With reference to FIGS. 4 and 5, a substrate 100b includes a lower substrate 101 and an upper substrate 102. The lower substrate 101 includes an upper conductive layer 101a, an insulation layer 101b, and a lower conductive layer 101c. The upper substrate 102 includes an upper conductive layer 102c, an insulation layer 102b, and a lower conductive layer 102a. According to an embodiment of the present disclosure, the low-side semiconductor elements 300a, 300b, 300c, and 300d, the second input terminal 510, and the alternating current terminal 430 are described as being arranged on the lower substrate 101. Therefore, the electric current applied through the second input terminal 510 flows into the low-side semiconductor elements 300a, 300b, 300c, and 300d through the upper conductive layer 101a of the lower substrate 101. Electric currents that result from conversion through the low-side semiconductor elements 300a, 300b, 300c, and 300d flow into the lower conductive layer 102a of the upper substrate 102 through the spacers 310a and 310d. The electric current is transferred to the connection terminal 530 through the lower conductive layer 102a of the upper substrate 102.

Slit insulation portions 160a, 160b, 180a, and 180b are formed in one or both of the lower substrate 101 and the upper substrate 102. In one embodiment, the slit insulation portions 160a, 160b, 180a, and 180b are formed in the lower substrate 101, which is a substrate on which the low-side semiconductor elements 300a, 300b, 300c, and 300d are mounted. In another embodiment, the slit insulation portions 160a, 160b, 180a, and 180b may be formed in the upper substrate 102.

The slit insulation portions 160a and 180a mean portions that result from removing, portions, respectively, of the upper conductive layer 101a from the lower substrate 101. The slit insulation portions 160b and 180b mean portions that result from removing, portions, respectively, of the lower conductive layer 102a from the lower substrate 102. With the removal of the portions of the upper and lower conductive layers 101a and 102a, respectively a pattern is formed in each of the upper conductive layers 101a of the lower substrate 101 and the lower conductive layer 102a of the upper substrate 102. Paths for electric current are determined by the patterns, respectively. Therefore, with the slit insulation portions 160a, 160b, 180a, and 180b, the electric current applied through the second input terminal 510 flows into the second center region 50b.

The embodiments of the present disclosure are described above with reference to the accompanying drawings, and it should be apparent to a person of ordinary skill in the art to which the present disclosure pertains that the present disclosure can be implemented into other embodiments without modification to the technical idea and essential feature thereof. Therefore, it should be understood that, in every aspect, the embodiments described above are examples and are not restrictive.

What is claimed is:

1. A structure of a substrate for application in an electric power module, wherein the substrate comprises:
    element regions, on which a plurality of semiconductor elements is arranged;
    a center region that defines a space among the element regions;
    an input terminal region, on which an input terminal for applying an electric current to the substrate is disposed; and
    slit insulation portions that are defined to face toward sides, respectively, of the element regions adjacent to the input terminal region, which are among the element regions,
    wherein the slit insulation portions extend toward the center region to guide the electric current applied through the input terminal region to flow into the center region, and
    wherein the slit insulation portions include a first slit insulation portion disposed between the input terminal region and one element region adjacent to the input terminal region and a second slit insulation portion disposed between the input terminal region and another element region adjacent to the input terminal region.

2. The structure according to claim 1, wherein the element regions include a first element region, a second element region, a third element region, and a fourth element region that are counterclockwise defined in this order,
    wherein the first element region and the fourth element region are adjacent to the input terminal region, and
    wherein the first slit insulation portion is defined between the first element region and the input terminal region, and the second slit insulation portion is defined between the fourth element region and the input terminal region.

3. The structure according to claim 2, wherein the first slit insulation portion and the second slit insulation portion extend from one side of the substrate, on which the input terminal region is defined, toward another side thereof that faces the one side of the substrate.

4. The structure according to claim 3, wherein the first slit insulation portion extends in such a manner as to be closer to the other side of the substrate than the second slit insulation portion.

5. The structure according to claim 2, wherein the first slit insulation portion and the second slit insulation portion are arranged between the first element region and the fourth element region.

6. The structure according to claim 2, wherein the first slit insulation portion includes a first main slit insulation portion that is defined between the input terminal region and the first element region, and a first sub-slit insulation portion that is defined to face toward one side of the first element region, and
    wherein the second slit insulation portion includes a second main slit insulation portion that is defined between the input terminal region and the fourth element region, and a second sub-slit insulation portion that is defined to face toward one side of the fourth element region.

7. The structure according to claim 6, wherein the first sub-slit insulation portion extends in a direction from the first element region toward the second element region, and
    wherein the second sub-slit insulation portion extends in a direction from the fourth element region toward the third element region.

8. The structure according to claim 7, wherein the first sub-slit insulation portion does not protrude beyond an end of the first element region in the direction from the first element region toward the second element region, and
    wherein the second sub-slit insulation portion does not protrude beyond an end of the fourth element region in the direction from the fourth element region toward the third element region.

9. The structure according to claim 1, wherein the center region means a region that covers a fixed area, of which a center point is positioned equidistantly from the element regions, and the electric current applied through the input terminal region is applied to the element regions through the center region.

10. The structure according to claim 1, wherein the substrate comprises:

a source signal electrode portion that transfers a source signal to the semiconductor elements; and a gate signal electrode portion that transfers a gate signal to the semiconductor elements, wherein the source signal electrode portion and the gate signal electrode portion are connected to the semiconductor elements through a wire.

11. The structure according to claim 10, further comprising:

a first electrode insulation portion that is provided between the gate signal electrode portion and the source signal electrode portion; and a second electrode insulation portion that is provided between an outer boundary of the source signal electrode and an edge of the substrate.

12. A structure of a substrate having a first region and a second region for application in an electric power module, wherein each of the first region and the second region comprises:

element regions, on which a plurality of semiconductor elements is arranged;

a center region that defines a space among the element regions;

an input terminal region, on which an input terminal for applying an electric current to the substrate is disposed; and slit insulation portions that are defined to face toward sides, respectively, of the element regions adjacent to the input terminal region, which are among the element regions, wherein the slit insulations portions extend toward the center region to guide the electric current applied through the input terminal region to flow into the center region, wherein the input terminal region comprises a first input terminal region, which is disposed on the first region and, to which an electric current is applied from the outside, and a second input terminal region that applies the electric current transferred from each of the semiconductor elements arranged on the first region to the second region, and wherein the slit insulation portions comprise a first slit insulation portion and a second slit insulation portion that extend from one side of the first region, on which the first input terminal region is defined, toward another side of the first region that faces the one side of the first region, and a third slit insulation portion and a fourth slit insulation portion that extend from one side of the second region, on which the second input terminal region is defined, toward another side of the second region that faces the one side of the second region.

13. The structure according to claim 12, wherein the element regions adjacent to the first input terminal region, which are among the element regions defined on the first region, are defined as first lower element regions, wherein the element regions adjacent to the second input terminal region, which are among the element regions defined on the second region, are defined as second lower element regions, wherein the slit insulation portions are provided to face toward one side of each of the first lower element regions and one side of each of the second lower element regions, and wherein the slit insulation portions are provided among the first lower element regions and among the second lower element regions.

14. The structure according to claim 13, wherein the first slit insulation portion and the second slit insulation portion are defined to face toward sides, respectively, of the first lower element regions, and wherein the first slit insulation portion and the second slit insulation portion do not protrude beyond ends, respectively, of the first lower element regions that are adjacent thereto.

15. The structure according to claim 13, wherein the third slit insulation portion and the fourth slit insulation portion are provided to face toward sides, respectively, of the second lower element regions, and wherein the third slit insulation portion and the fourth slit insulation portion do not protrude beyond ends, respectively, of the second lower element regions that are adjacent thereto.

* * * * *